(12) United States Patent
Han et al.

(10) Patent No.: US 11,563,036 B2
(45) Date of Patent: Jan. 24, 2023

(54) ARRAY SUBSTRATE AND FABRICATION METHOD THEREOF, DISPLAY PANEL AND DISPLAY MODULE

(71) Applicants: Ordos Yuansheng Optoelectronics Co., Ltd., Inner Mongolia (CN); BOE Technology Group Co., Ltd., Beijing (CN)

(72) Inventors: Shuai Han, Beijing (CN); Jingyi Xu, Beijing (CN); Xin Zhao, Beijing (CN); Wulijibaier Tang, Beijing (CN); Yanwei Ren, Beijing (CN); Yanan Yu, Beijing (CN); Yuelin Wang, Beijing (CN); Guolei Zhi, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 270 days.

(21) Appl. No.: 16/915,213

(22) Filed: Jun. 29, 2020

(65) Prior Publication Data
US 2020/0411562 A1    Dec. 31, 2020

(30) Foreign Application Priority Data

Jun. 28, 2019  (CN) .......................... 201910579285.1

(51) Int. Cl.
*H01L 27/12*   (2006.01)
*H01L 23/00*   (2006.01)
*G02F 1/136*   (2006.01)

(52) U.S. Cl.
CPC ............ *H01L 27/124* (2013.01); *G02F 1/136* (2013.01); *H01L 24/13* (2013.01); *H01L 24/14* (2013.01); *H01L 27/1259* (2013.01); *H01L 2224/13012* (2013.01); *H01L 2224/13562* (2013.01); *H01L 2224/14155* (2013.01)

(58) Field of Classification Search
None
See application file for complete search history.

(56) References Cited

FOREIGN PATENT DOCUMENTS

CN           109979978        *  7/2019

\* cited by examiner

*Primary Examiner* — Ashok Patel
(74) *Attorney, Agent, or Firm* — Nath, Goldberg & Meyer; Joshua B. Goldberg

(57) ABSTRACT

The present disclosure provides an array substrate and a fabrication method thereof, a display panel and a display module. The array substrate has a display region and a bonding region for bonding with a circuit board, and including: a data line and a gate line in the display region; and a bump unit in the bonding region. The bump unit includes: a gate line bump layer, which is in a same layer and made of a same material as the gate line, is connected to the data line, and includes a main body portion and a plurality of hollowed-out portions in the main body portion; and a data line bump layer, which is in a same layer and made of a same material as the data line, and covers the main body portion and the plurality of hollowed-out portions of the gate line bump layer.

19 Claims, 4 Drawing Sheets

ARRAY SUBSTRATE AND FABRICATION METHOD THEREOF, DISPLAY PANEL AND DISPLAY MODULE

CROSS-REFERENCE TO RELATED APPLICATION

This application claims the benefit of priority to Chinese Patent Application No. 201910579285.1 filed on Jun. 28, 2019, the contents of which are incorporated herein in their entirety by reference.

TECHNICAL FIELD

The present disclosure relates to the field of display technology, and particularly relates to an array substrate, a fabrication method thereof, a display panel, and a display module.

BACKGROUND

With the arrival of the 'full screen' era, a display screen with a high screen-to-body ratio is favored by consumers. In order to adapt to the trend, screen manufacturers select chip on film (COF) module processes, in which driver ICs are fixed on a flexible circuit board, so as to reduce the space occupied by the bezel of the screen and realize the preparation of ultra-narrow bezel products.

SUMMARY

The present disclosure provides an array substrate having a display region and a bonding region for bonding with a circuit board, and including: a data line and a gate line in the display region; and a bump unit in the bonding region. The bump unit includes: a gate line bump layer, which is in a same layer and made of a same material as the gate line, is connected to the data line, and includes a main body portion and a plurality of hollowed-out portions in the main body portion; and a data line bump layer, which is in a same layer and made of a same material as the data line, covers the main body portion and the plurality of hollowed-out portions of the gate line bump layer, and includes a first portion and a second portion, wherein an orthographic projection of the first portion on the gate line bump layer is within the main body portion of the gate line bump layer, an orthographic projection of the second portion on the gate line bump layer is within the hollowed-out portions of the gate line bump layer, and a sum of a thicknesses of the first portion and a thicknesses of the main body portion of the gate line bump layer is larger than a thicknesses of the second portion.

In an embodiment of the present disclosure, the bump unit further includes a conductive layer covering the data line bump layer on a side of the data line bump layer away from the gate line bump layer, the conductive layer includes a third portion and a fourth portion, an orthographic projection of the third portion on the gate line bump layer is within the main body portion of the gate line bump layer and at least partially overlaps with the orthographic projection of the first portion on the gate line bump layer, an orthographic projection of the fourth portion on the gate line bump layer is within the hollowed-out portions of the gate line bump layer and at least partially overlaps with the orthographic projection of the second portion on the gate line bump layer, and a sum of thicknesses of the third portion, the first portion and the main body portion is greater than a sum of thicknesses of the fourth portion and the second portion.

In an embodiment of the present disclosure, the conductive layer is a conductive metal oxide layer.

In an embodiment of the present disclosure, the main body portion includes a plurality of segments arranged at intervals along an extending direction of the gate line, an interval between any two adjacent segments forms the hollowed-out portion, each segment is strip-shaped, and an angle between a length direction of the segment and an extending direction of the data line is greater than or equal to 0 degree and less than 45 degrees.

In an embodiment of the present disclosure, the plurality of segments are independent of each other and electrically connected to each other through the data line bump layer.

In an embodiment of the present disclosure, the gate line bump layer further includes a connection portion electrically connecting end portions of the plurality of segments at one side of the gate line bump layer.

In an embodiment of the present disclosure, the main body portion includes segments arranged in an array in a first direction and a second direction, an interval between any two adjacent segments forms the hollowed-out portion, the first direction is parallel to an extending direction of the gate line, and an angle between the second direction and an extending direction of the data line is greater than or equal to 0 degree and less than 45 degrees.

In an embodiment of the present disclosure, each of the segments has a strip shape, and a length direction of each of the segments is parallel to the second direction.

In an embodiment of the present disclosure, the main body portion includes a plurality of segments arranged at intervals along a second direction, an interval between any two adjacent segments forms the hollowed-out portion, each segment has a strip shape with a same length, a length direction of the segment is parallel to an extending direction of the gate line, and an angle between the second direction and an extending direction of the data line is greater than or equal to 0 degree and smaller than 45 degrees.

In an embodiment of the present disclosure, the main body portion includes a plurality of segments arranged at intervals along a second direction, an interval between any two adjacent segments forms the hollowed-out portion, each segment has a strip shape with a same length, an angle between a length direction of the segment and an extending direction of the gate line is greater than or equal to 0 degree and less than 45 degrees, and an angle between the second direction and an extending direction of the data line is greater than or equal to 0 degree and less than 45 degrees.

In an embodiment of the present disclosure, the plurality of hollowed-out portions are a plurality of through holes formed in and penetrating through the main body portion in a thickness direction of the main body portion.

In an embodiment of the present disclosure, the plurality of through holes are arranged in an array in a first direction and a second direction, the first direction is parallel to an extending direction of the gate line, and an angle between the second direction and an extending direction of the data line is greater than or equal to 0 degree and less than 45 degrees.

In an embodiment of the present disclosure, the plurality of through holes are arranged in an array in only one of a first direction and a second direction, the first direction is parallel to an extending direction of the gate line, and an angle between the second direction and an extending direction of the data line is greater than or equal to 0 degree and less than 45 degrees.

In an embodiment of the present disclosure, the bump unit includes a plurality of gate line bump layers arranged at intervals along a direction parallel to an extending direction of the gate line, each gate line bump layer is connected to one corresponding data line, and the data line bump layer covers all the gate line bump layers.

The present disclosure also provides a method of fabricating an array substrate, the array substrate having a display region and a bonding region for bonding with a circuit board, and including a data line and a gate line in the display region and a bump unit in the bonding region. The method includes: forming a gate line material layer; performing a patterning process on the gate line material layer to form a pattern including the gate line and a gate line bump layer, wherein the gate line bump layer is connected with the data line, and the gate line bump layer is formed to include a main body portion and a plurality of hollowed-out portions in the main body portion; forming a data line material layer on the patterned gate line material layer; and performing a patterning process on the data line material layer to form a pattern including the data line and a data line bump layer, wherein the data line bump layer covers the main body portion and the plurality of hollowed-out portions of the gate line bump layer, the data line bump layer is formed to include a first portion and a second portion, an orthographic projection of the first portion on the gate line bump layer is within the main body portion of the gate line bump layer, an orthographic projection of the second portion on the gate line bump layer is within the hollowed-out portions of the gate line bump layer, and a sum of a thicknesses of the first portion and a thicknesses of the main body portion of the gate line bump layer is larger than a thickness of the second portion.

In an embodiment of the present disclosure, after performing the patterning process on the data line material layer to form the pattern including the data line and the data line bump layer, the method further includes: forming a conductive layer covering the data line bump layer on a side of the patterned data line material layer away from the patterned gate line material layer, wherein the conductive layer is formed to include a third portion and a fourth portion, an orthographic projection of the third portion on the gate line bump layer is within the main body portion of the gate line bump layer and at least partially overlaps with the orthographic projection of the first portion on the gate line bump layer, an orthographic projection of the fourth portion on the gate line bump layer is within the hollowed-out portions of the gate line bump layer and at least partially overlaps with the orthographic projection of the second portion on the gate line bump layer, and a sum of thicknesses of the third portion, the first portion and the main body portion is greater than a sum of thicknesses of the fourth portion and the second portion.

The present disclosure also provides a display panel, including the array substrate according to the present disclosure.

The present disclosure further provides a display module, including a display panel and a circuit board. The display panel is the display panel according to the present disclosure, and the circuit board is bonded in the bonding region of the array substrate of the display panel.

In an embodiment of the present disclosure, the circuit board is a chip on film.

DETAILED DESCRIPTION

Figure 1:
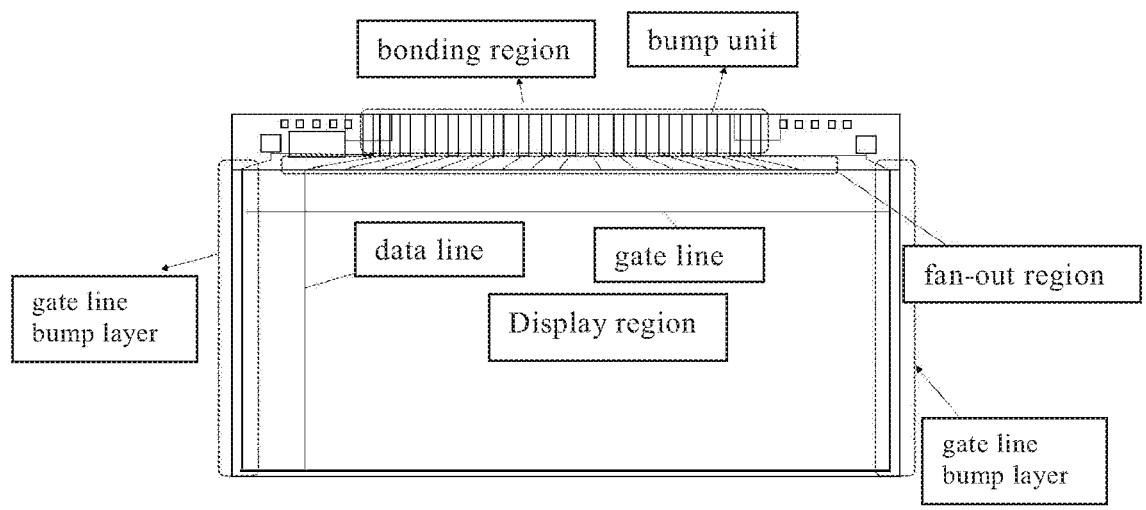
FIG. 1 is a region distribution diagram of an array substrate according to an embodiment of the present disclosure.

In order to make those skilled in the art better understand the technical solutions of the present disclosure, an array substrate, a fabrication method thereof, a display panel and a display module according to the present disclosure are described in detail below with reference to the accompanying drawings.

In order to realize an ultra-narrow bezel, the width of a bonding region of an array substrate needs to be reduced. The reduction of the width of the bonding region brings difficulty to guarantee of the drawing force of the COF. Reducing the width of the bonding region and passing the drawing force test of the COF become irreconcilable contradictions. Therefore, the present disclosure provides an array substrate capable of passing the drawing force test of the COF while satisfying the requirement on the width of the bonding region, a method of fabricating the array substrate, and a display panel and a display module including the array substrate.

FIG. 1 is a region distribution diagram of an array substrate according to an embodiment of the present disclosure. Referring to FIG. 1, an array substrate according to an embodiment of the present disclosure includes a display region, a fan-out region located at one side of the display region, a bonding region located at an outer side of the fan-out region, and a gate line bump region located at both sides of the display region and the bonding region. The data lines and the gate lines are arranged in the display region; and a bump unit used for bonding with a circuit board is provided in the bonding region. The circuit board is, for example, a chip on film (COF). The COF is bonded to the bump unit by an adhesive (e.g., an anisotropic conductive film). The gate line bump region is provided therein with a gate line bump which is connected with the gate line and is connected with the bump unit through silver paste.

It should be noted that the term "display region" used herein refers to a region of the array substrate where an image is actually displayed. In addition, in the present disclosure, two structures "in a same layer and made of a same material" mean that the two structures are formed by a same process using a same material layer.

Figure 2:
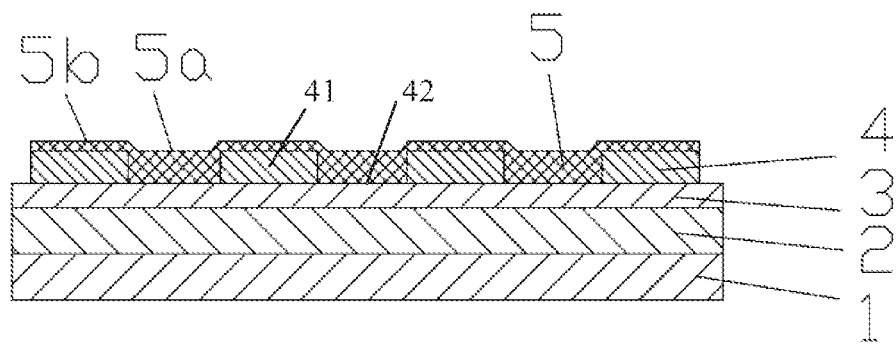
FIG. 2 is a partial cross-sectional view of a bump unit of an array substrate according to an embodiment of the present disclosure.

FIG. 2 is a partial cross-sectional view of a bump unit of an array substrate according to an embodiment of the present disclosure. Referring to FIG. 2, the array substrate includes a glass substrate 1, a buffer layer 2 disposed on the glass substrate 1, and a planarization layer 3 disposed on a side of the buffer layer 2 away from the glass substrate 1, and a bump unit disposed on a side of the planarization layer 3 away from the buffer layer 2. The bump unit includes a gate line bump layer 4 and a data line bump layer 5. The gate line bump layer 4 and the gate lines are located in a same layer and made of a same material, that is, both the gate line bump layer 4 and the gate lines are disposed on the planarization layer 3. The bump unit includes a plurality of gate line bump layers 4, and the plurality of gate line bump layers 4 are arranged at intervals in an X direction (parallel to an extending direction of the gate line). FIG. 2 shows a cross-sectional view of only one of the gate line bump layers 4.

Figure 3:
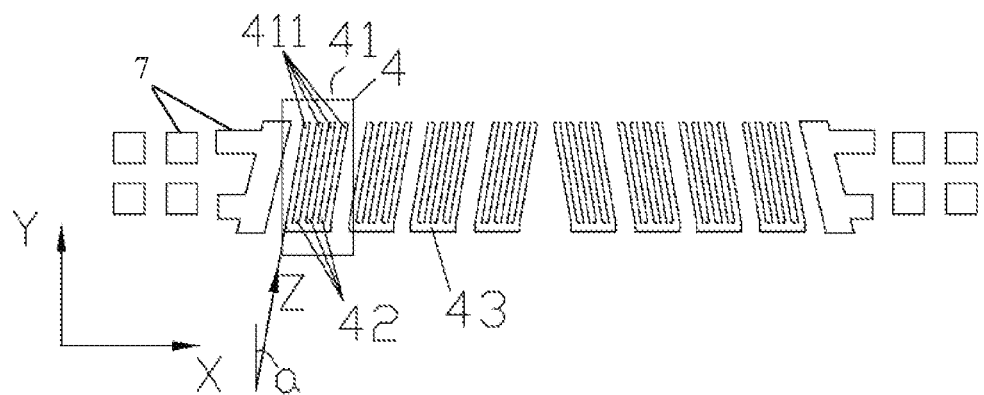
FIG. 3 is a structural diagram of a gate line bump layer in a bump unit of an array substrate according to an embodiment of the present disclosure.

FIG. 3 is a top view showing all the gate line bump layers 4. As shown in FIG. 3, the X direction is parallel to the extending direction of the gate line; the Y direction is parallel to the extending direction of the data line; the Z direction is a direction inclined with respect to the extending direction of the data line, that is, the Z direction is inclined with respect to the Y direction, and the angle between the Z direction and the Y direction is a. Each gate line bump layer 4 includes a main body portion 41 and a plurality of hollowed-out portions 42 in the main body portion 41. The data line bump layer 5 is located in a same layer and made of a same material as the data line, and covers all the gate line bump layers 4, that is, covers the respective main body portions 41 and the respective hollowed-out portions 42. The data line bump layer 5 includes a first portion 5b and a second portion 5a, an orthographic projection of the first portion 5b on the gate line bump layer 4 is within the main body portion 41 of the gate line bump layer 4, an orthographic projection of the second portion 5a on the gate line bump layer 4 is within the hollowed-out portion 42 of the gate line bump layer 4, and a sum of a thickness of the first portion 5b and a thickness of the main body portion 41 of the gate line bump layer 4 is greater than a thickness of the second portion 5a. In this way, an area, corresponding to the hollowed-out portion 42, of a surface of the data line bump layer 5 away from the gate line bump layer 4 may be lower than an area, corresponding to the main body portion 41, of the surface of the data line bump layer 5 away from the gate line bump layer 4, that is, the surface of the data line bump layer 5 away from the gate line bump layer 4 is formed as a concave-convex surface, so that the contact area between the data line bump layer 5 and a COF to be bonded can be increased, and further the drawing force of the COF can be improved. In addition, under the condition that the contact area of the data line bump layer 5 and the COF to be bonded is increased, the length of the gate line bump layer 4 in the Y direction can be properly reduced, so that the preparation of an ultra-narrow bezel product can be realized. In other words, the width of the bonding region can be reduced properly while ensuring that the drawing force of the COF satisfies the requirements. In some embodiments, the orthographic projection of the first portion 5b on the gate line bump layer 4 completely overlaps the main body portion 41 of the gate line bump layer 4, and the orthographic projection of the second portion 5a on the gate line bump layer 4 completely overlaps the hollowed-out portion 42 of the gate line bump layer 4.

In an embodiment of the present disclosure, as shown in FIG. 3, the main body portion 41 of each gate line bump layer 4 includes a plurality of segments 411 arranged at intervals in the X direction, and an interval between any two adjacent segments 411 constitutes the hollowed-out portion 42. Thus, the gate line bump layer 4 is formed as a concavo-convex structure in the X direction, so that the surface, which is away from the gate line bump layer 4, of the data line bump layer 5 covering and formed on the gate line bump layer 4 is correspondingly formed as a concavo-convex surface.

In the embodiment of the present disclosure, as shown in FIG. 3, each of the segments 411 is in a strip shape, a length direction of each of the segments 411 is parallel to the Z direction, and the angle a between the Z direction and the Y direction is greater than or equal to 0 degree and less than 45 degrees. For example, the segment 411 is rectangular, oval, or the like.

In some embodiments, each gate line bump layer 4 further includes a connection portion 43 connected to each of the segments 411, and the connection portion 43 is located at an end portion of the gate line bump layer 4 at one side of the gate line bump layer 4. By means of the connection portion 43, electrical connection between all the segments 411 can be achieved. In practical applications, the connection portion 43 may not be provided. In some embodiments, the plurality of segments 411 are independent of each other, and the electrical connection between all the segments 411 is achieved only by the data line bump layer 5.

Figure 4:
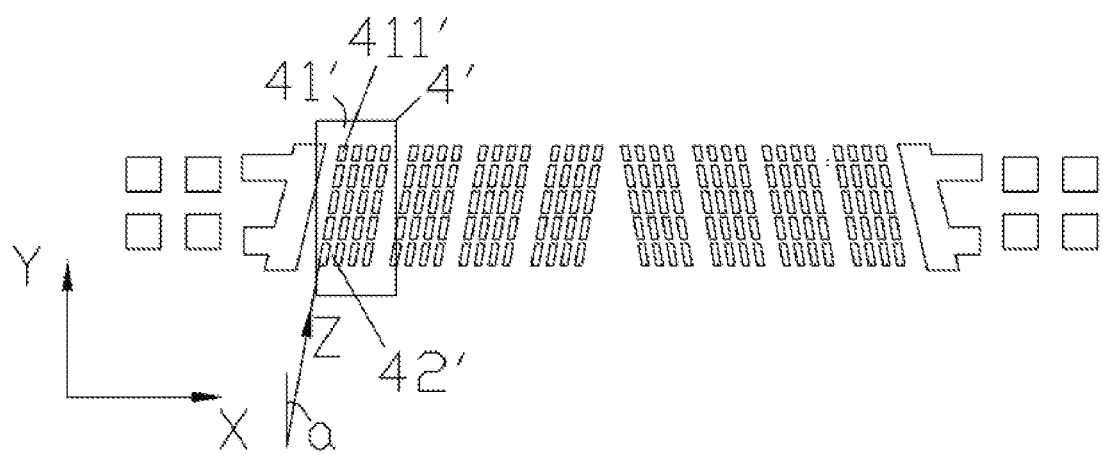
FIG. 4 is a structural diagram of a gate line bump layer in a bump unit of an array substrate according to an embodiment of the present disclosure.

In FIG. 3, in the Z direction, there is only one segment 411, but the present disclosure is not limited thereto. FIG. 4 illustrates another structure of a gate line bump layer in a bump unit of an array substrate according to an embodiment of the present disclosure. As shown in FIG. 4, the bump unit includes a plurality of gate line bump layers 4' arranged at intervals in the X direction, and each gate line bump layer 4' includes a main body portion 41' and a plurality of hollowed-out portions 42' disposed in the main body portion 41'. The main body portion 41' includes a plurality of segments 411' respectively arranged along the X direction and the Z direction at intervals, that is, the plurality of segments 411' are arranged in an array in the X direction and the Z direction, and the interval between any two adjacent segments 411' constitutes the hollowed-out portion 42'. The angle between the Z direction and the Y direction is greater than or equal to 0 degree and less than 45 degrees. Thus, the gate line bump layer 4' is formed as a concavo-convex structure in both the X direction and the Z direction, so that the surface, which is away from the gate line bump layer 4', of the data line bump layer 5 covering and formed on the gate line bump layer 4' is correspondingly formed as a concavo-convex surface.

In some embodiments, as shown in FIG. 3, each segment 411' has a strip shape, and the length direction of the segment 411' is parallel to the Z direction, but the present disclosure is not limited thereto. In practical applications, each segment 411' may have a shape with an aspect ratio equal to 1, such as a square or a circle. In FIG. 3, alignment marks 7 are further provided on both sides of the bump unit, and are used to prevent misalignment during bonding.

Figure 5:
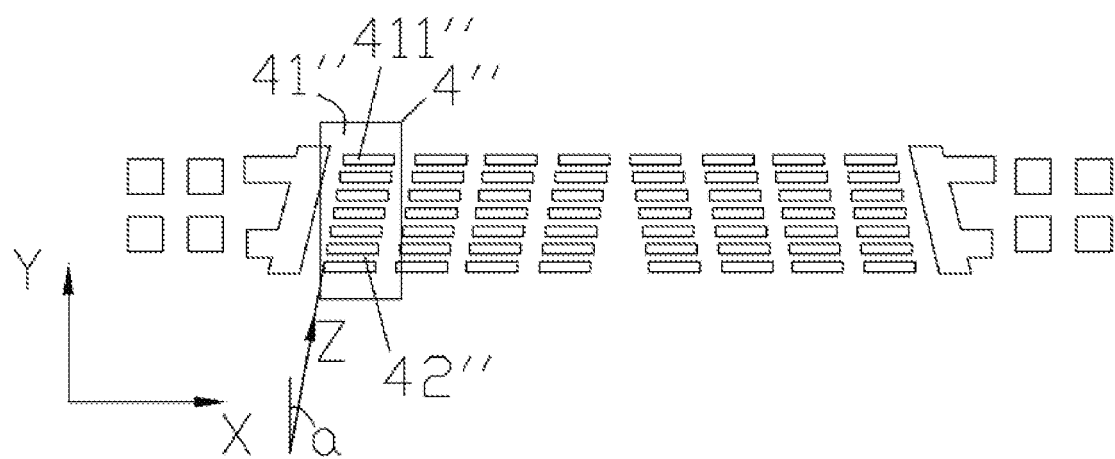
FIG. 5 is a structural diagram of a gate line bump layer in a bump unit of an array substrate according to an embodiment of the present disclosure.

FIG. 5 illustrates another structure of a gate line bump layer in a bump unit of an array substrate according to an embodiment of the present disclosure. As shown in FIG. 5, the bump unit includes a plurality of gate line bump layers 4" arranged at intervals in the X direction, and each gate line bump layer 4" includes a main body portion 41" and a plurality of hollowed-out portions 42" in the main body portion 41". The main body 41" includes a plurality of segments 411" arranged at intervals in the Z direction, and the interval between two adjacent segments 411" constitutes the hollowed-out portion 42'. Thus, each gate line bump layer 4" is formed as a concave-convex structure in the Z direction, so that the surface, which is away from the gate line bump layer 4", of the data line bump layer 5 covering and formed on the gate line bump layer 4" is correspondingly formed as a concavo-convex surface.

In some embodiments, as shown in FIG. 5, each of the segments 411" has a strip shape with the same length, and the length direction of the segment 411" is parallel to the X direction. For example, the segment 411" is rectangular, oval, or the like.

Figure 6:
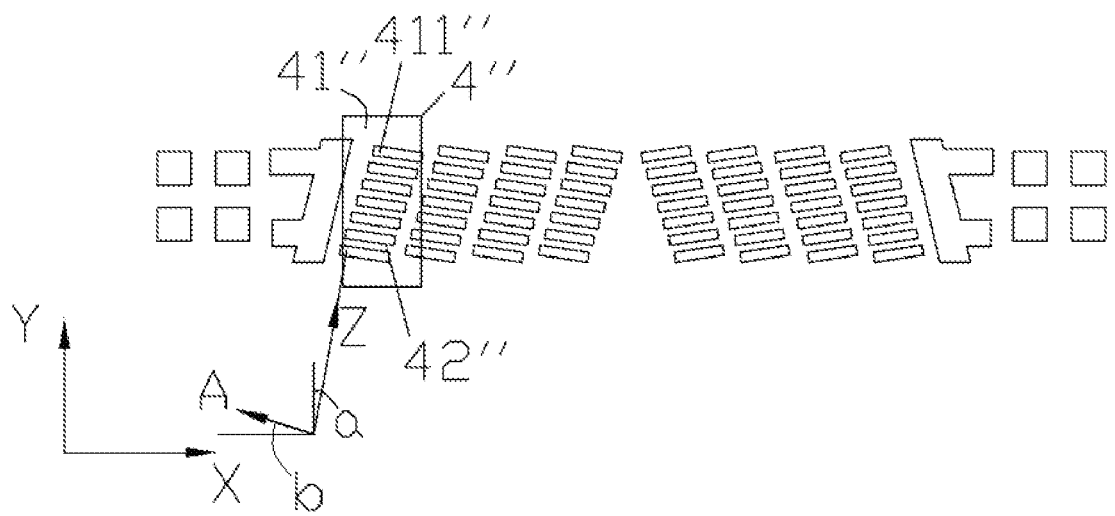
FIG. 6 is a structural diagram of a gate line bump layer in a bump unit of an array substrate according to an embodiment of the present disclosure.

It should be noted that, in the present embodiment, the length direction of the segment 411" and the X direction are parallel to each other, but the present disclosure is not limited thereto. In practical applications, the angle between the length direction of the segment 411" and the X direction may be greater than 0 degree and less than 45 degrees. For example, as shown in FIG. 6, the length direction of the segment 411" is A direction, and the angle b between the A direction and the X direction is greater than 0 degree and less than 45 degrees.

Figure 7:
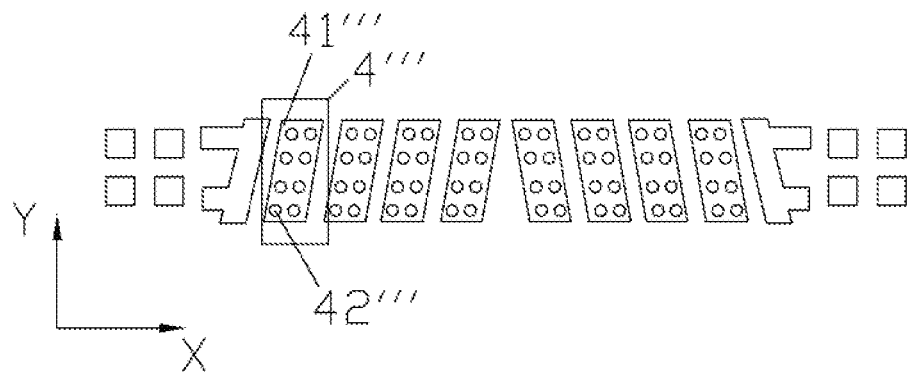
FIG. 7 is a structural diagram of a gate line bump layer in a bump unit of an array substrate according to an embodiment of the present disclosure.

FIG. 7 illustrates another structure of a gate line bump layer in a bump unit of an array substrate according to an embodiment of the present disclosure. As shown in FIG. 7, the bump unit includes a plurality of gate line bump layers 4''' arranged at intervals in the X direction, and each of the gate line bump layers 4''' includes a main body portion 41' and a plurality of hollowed-out portions 42''' in the main body portion 41'''. The main body portion 41' is of a unitary structure (i.e., a structure including no break), and the hollowed-out portion 42''' is a through hole formed in and penetrating through the main body portion 41''' in a thickness direction of the main body portion 41'''.

In some embodiments, the hollowed-out portion 42''' is a plurality of through holes arranged in an array in the X-direction and the Z-direction. In this way, the gate line bump layer 4''' is formed as a concave-convex structure in both the X direction and Y direction, so that the surface, which is away from the gate line bump layer 4''', of the data line bump layer 5 covering and formed on the gate line bump layer 4''' is correspondingly formed as a concavo-convex surface.

It should be noted that, in the present embodiment, the plurality of through holes are arranged at intervals in the X direction and the Z direction, but the present disclosure is not limited thereto. In practical applications, the through holes may be arranged at intervals only along the X direction or the Z direction.

Figure 8:
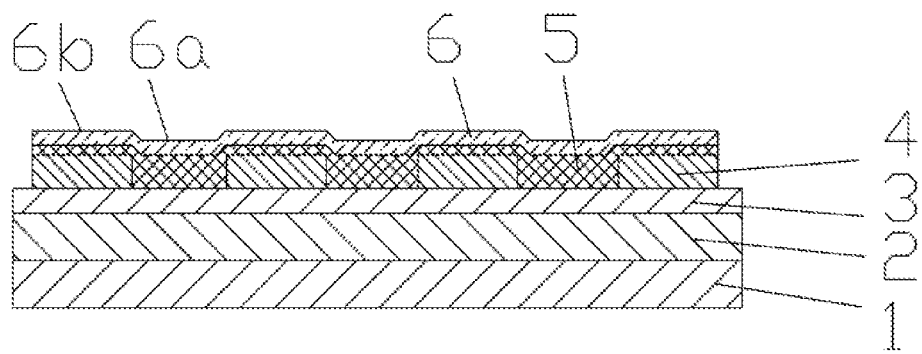
FIG. 8 is a cross-sectional view of a bump unit of an array substrate according to an embodiment of the present disclosure.

FIG. 8 is a cross-sectional view of a bump unit of an array substrate according to an embodiment of the present disclosure. As shown in FIG. 8, each bump unit further includes a conductive layer 6, and the conductive layer 6 covers the data line bump layer 5 at a side of the data line bump layer 5 away from the gate line bump layer 4. The conductive layer includes a third portion 6b and a fourth portion 6a, an orthographic projection of the third portion 6b on the gate line bump layer 4 is within the main body portion 41 of the gate line bump layer 4 and at least partially overlaps with the orthographic projection of the first portion 5b on the gate line bump layer 4, an orthographic projection of the fourth portion 6a on the gate line bump layer 4 is within the hollowed-out portion 42 of the gate line bump layer 4 and at least partially overlaps with the orthographic projection of the second portion 5a on the gate line bump layer 4, and a sum of thicknesses of the third portion 6b, the first portion 5b and the main body portion 41 is greater than a sum of thicknesses of the fourth portion 6a and the second portion 5a. In some embodiments, the orthographic projection of the third portion 6b on the gate line bump layer 4 and the orthographic projection of the first portion 5b on the gate line bump layer 4 both completely overlap with the main body portion 41 of the gate line bump layer 4, and the orthographic projection of the fourth portion 6a on the gate line bump layer 4 and the orthographic projection of the second portion 5a on the gate line bump layer 4 both completely overlap with the hollowed-out portion 42 of the gate line bump layer 4. Thus, the area, corresponding to each hollowed-out portion, of the surface of the conductive layer 6 away from the data line bump layer 5 is lower than the area, corresponding to the main body portion, of the surface of the conductive layer 6 away from the data line bump layer 5. The conductive layer 6 is configured to be connected with the COF. In some embodiments, the conductive layer 6 is a conductive metal oxide layer.

The embodiments of the present disclosure provide a fabrication method of an array substrate. The array substrate has a display region and a bonding region for bonding with a circuit board, and includes data lines and gate lines disposed in the display region, and a bump unit disposed in the bonding region. The method includes steps of:

forming a gate line material layer;

performing a patterning process on the gate line material layer to form patterns including the gate lines and a plurality of gate line bump layers; the plurality of gate line bump layer being connected with the data lines in one-to-one correspondence, and each gate line bump layer being formed to include a main body portion and a plurality of hollowed-out portions arranged in the main body portion;

forming a data line material layer on the patterned gate line material layer; and performing a patterning process on the data line material layer to form a patterns including the data lines and a data line bump layer; the data line bump layer covering all the gate line bump layers, the data line bump layer being formed to include a first portion and a second portion, an orthographic projection of the first portion on the gate line bump layer being within the main body portion of the gate line bump layer, an orthographic projection of the second portion on the gate line bump layer being within the hollowed-out portion of the gate line bump layer, and a sum of thicknesses of the first portion and the main body portion of the gate line bump layer being larger than a thickness of the second portion.

Therefore, the surface of the data line bump layer away from the gate line bump layer can be formed as a concave-convex surface, so that the contact area between the data line bump layer and the COF to be bonded can be increased, and the drawing force of the COF can be improved. In addition, under the condition that the contact area of the data line bump layer and the COF to be bonded is increased, the length of the gate line bump layer 4 in the extending direction of the data line can be properly reduced, so that the preparation of an ultra-narrow bezel product can be realized.

In some embodiments, after the step of performing a patterning process on the data line material layer to form patterns including the data lines and the data line bump layer, the method further includes:

forming, on a side of the patterned data line material layer away from the patterned gate line material layer, a conductive layer covering the data line bump layer, the conductive layer being formed to include a third portion and a fourth portion, an orthographic projection of the third portion on the gate line bump layer is within the main body portion of the gate line bump layer and at least partially overlapping with the orthographic projection of the first portion on the gate line bump layer, an orthographic projection of the fourth portion on the gate line bump layer being within the hollowed-out portion of the gate line bump layer and at least partially overlapping with orthographic projection of the second portion on the gate line bump layer, and a sum of thicknesses of the third portion, the first portion and the main body portion being larger than a sum of thicknesses of the fourth portion and the second portion.

The conductive layer is used for connection with the COF. In some embodiments, the conductive layer is a conductive metal oxide layer.

The embodiments of the present disclosure further provide a display panel, which includes the array substrate according to the embodiments of the present disclosure.

In the display panel according to the embodiments of the present disclosure, the array substrate according to the embodiments of the present disclosure is adopted, so that the preparation of an ultra-narrow bezel product can be realized while the drawing force of the COF is ensured to meet the requirement.

The embodiments of the present disclosure further provide a display module, which includes a display panel and a circuit board, the circuit board is bonded in the bonding region of the array substrate of the display panel, and the array substrate is the display substrate according the embodiments of the present disclosure.

In some embodiments, the circuit board is a chip on film (i.e., COF).

In the display module according to the embodiments of the present disclosure, the array substrate according to the embodiments of the present disclosure is adopted, so that the preparation of an ultra-narrow bezel product can be realized while the drawing force of the COF is ensured to meet the requirement.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. An array substrate having a display region and a bonding region for bonding with a circuit board, and comprising:
   a data line and a gate line in the display region; and
   a bump unit in the bonding region, comprising:
      a gate line bump layer, which is in a same layer and made of a same material as the gate line, is connected to the data line, and comprises a main body portion and a plurality of hollowed-out portions in the main body portion; and
      a data line bump layer, which is in a same layer and made of a same material as the data line, covers the main body portion and the plurality of hollowed-out portions of the gate line bump layer, and comprises a first portion and a second portion, wherein an orthographic projection of the first portion on the gate line bump layer is within the main body portion of the gate line bump layer, an orthographic projection of the second portion on the gate line bump layer is within the hollowed-out portions of the gate line bump layer, and a sum of a thicknesses of the first portion and a thicknesses of the main body portion of the gate line bump layer is larger than a thicknesses of the second portion.

2. The array substrate of claim 1, wherein the bump unit further comprises a conductive layer covering the data line bump layer on a side of the data line bump layer away from the gate line bump layer,
   the conductive layer comprises a third portion and a fourth portion, an orthographic projection of the third portion on the gate line bump layer is within the main body portion of the gate line bump layer and at least partially overlaps with the orthographic projection of the first portion on the gate line bump layer, an orthographic projection of the fourth portion on the gate line bump layer is within the hollowed-out portions of the gate line bump layer and at least partially overlaps with the orthographic projection of the second portion on the gate line bump layer, and a sum of thicknesses of the third portion, the first portion and the main body portion is greater than a sum of thicknesses of the fourth portion and the second portion.

3. The array substrate of claim 2, wherein the conductive layer is a conductive metal oxide layer.

4. The array substrate of claim 1, wherein the main body portion comprises a plurality of segments arranged at intervals along an extending direction of the gate line, an interval between any two adjacent segments forms the hollowed-out portion, each segment is strip-shaped, and an angle between a length direction of the segment and an extending direction of the data line is greater than or equal to 0 degree and less than 45 degrees.

5. The array substrate of claim 4, wherein the plurality of segments are independent of each other and electrically connected to each other through the data line bump layer.

6. The array substrate of claim 4, wherein the gate line bump layer further comprises a connection portion electrically connecting end portions of the plurality of segments at one side of the gate line bump layer.

7. The array substrate of claim 1, wherein the main body portion comprises segments arranged in an array in a first direction and a second direction, an interval between any two adjacent segments forms the hollowed-out portion, the first direction is parallel to an extending direction of the gate line, and an angle between the second direction and an extending direction of the data line is greater than or equal to 0 degree and less than 45 degrees.

8. The array substrate of claim 7, wherein each of the segments has a strip shape, and a length direction of each of the segments is parallel to the second direction.

9. The array substrate of claim 1, wherein the main body portion comprises a plurality of segments arranged at intervals along a second direction, an interval between any two adjacent segments forms the hollowed-out portion, each segment has a strip shape with a same length, a length direction of the segment is parallel to an extending direction of the gate line, and an angle between the second direction and an extending direction of the data line is greater than or equal to 0 degree and smaller than 45 degrees.

10. The array substrate of claim 1, wherein the main body portion comprises a plurality of segments arranged at intervals along a second direction, an interval between any two adjacent segments forms the hollowed-out portion, each segment has a strip shape with a same length, an angle between a length direction of the segment and an extending direction of the gate line is greater than or equal to 0 degree and less than 45 degrees, and an angle between the second direction and an extending direction of the data line is greater than or equal to 0 degree and less than 45 degrees.

11. The array substrate of claim 1, wherein the plurality of hollowed-out portions are a plurality of through holes formed in and penetrating through the main body portion in a thickness direction of the main body portion.

12. The array substrate of claim 11, wherein the plurality of through holes are arranged in an array in a first direction and a second direction, the first direction is parallel to an extending direction of the gate line, and an angle between the second direction and an extending direction of the data line is greater than or equal to 0 degree and less than 45 degrees.

13. The array substrate of claim 11, wherein the plurality of through holes are arranged in an array in only one of a first direction and a second direction, the first direction is parallel to an extending direction of the gate line, and an angle between the second direction and an extending direction of the data line is greater than or equal to 0 degree and less than 45 degrees.

14. The array substrate of claim 1, wherein the bump unit comprises a plurality of gate line bump layers arranged at intervals along a direction parallel to an extending direction of the gate line, each gate line bump layer is connected to one corresponding data line, and the data line bump layer covers all the gate line bump layers.

15. A method of fabricating an array substrate, the array substrate having a display region and a bonding region for bonding with a circuit board, and comprising a data line and a gate line in the display region and a bump unit in the bonding region, wherein the method comprises:
  forming a gate line material layer;
  performing a patterning process on the gate line material layer to form a pattern comprising the gate line and a gate line bump layer, wherein the gate line bump layer is connected with the data line, and the gate line bump layer is formed to comprise a main body portion and a plurality of hollowed-out portions in the main body portion;
  forming a data line material layer on the patterned gate line material layer;
  performing a patterning process on the data line material layer to form a pattern comprising the data line and a data line bump layer, wherein the data line bump layer covers the main body portion and the plurality of hollowed-out portions of the gate line bump layer, the data line bump layer is formed to comprise a first portion and a second portion, an orthographic projection of the first portion on the gate line bump layer is within the main body portion of the gate line bump layer, an orthographic projection of the second portion on the gate line bump layer is within the hollowed-out portions of the gate line bump layer, and a sum of a thicknesses of the first portion and a thicknesses of the main body portion of the gate line bump layer is larger than a thickness of the second portion.

16. The method of claim 15, wherein after performing the patterning process on the data line material layer to form the pattern comprising the data line and the data line bump layer, the method further comprises:
  forming a conductive layer covering the data line bump layer on a side of the patterned data line material layer away from the patterned gate line material layer, wherein the conductive layer is formed to comprise a third portion and a fourth portion, an orthographic projection of the third portion on the gate line bump layer is within the main body portion of the gate line bump layer and at least partially overlaps with the orthographic projection of the first portion on the gate line bump layer, an orthographic projection of the fourth portion on the gate line bump layer is within the hollowed-out portions of the gate line bump layer and at least partially overlaps with the orthographic projection of the second portion on the gate line bump layer, and a sum of thicknesses of the third portion, the first portion and the main body portion is greater than a sum of thicknesses of the fourth portion and the second portion.

17. A display panel, comprising the array substrate of claim 1.

18. A display module, comprising a display panel and a circuit board, wherein the display panel is the display panel of claim 17, and the circuit board is bonded in the bonding region of the array substrate of the display panel.

19. The display module of claim 18, wherein the circuit board is a chip on film.

* * * * *